United States Patent [19]
Jung et al.

[11] Patent Number: 5,159,284
[45] Date of Patent: Oct. 27, 1992

[54] NOISE REDUCTION CIRCUIT WITH A MAIN SIGNAL PATH AND AN AUXILIARY SIGNAL PATH HAVING A HIGH-PASS FILTER CHARACTERISTIC

[75] Inventors: Duck-young Jung, Incheon; Seung-yup Koo, Seoul, both of Rep. of Korea

[73] Assignee: Samsung Electronics Co., Ltd., Kyunggi-do, Rep. of Korea

[21] Appl. No.: 811,238

[22] Filed: Dec. 20, 1991

[30] Foreign Application Priority Data

Jun. 14, 1991 [KR] Rep. of Korea .................. 91-9841

[51] Int. Cl.$^5$ .............................................. H03F 1/26
[52] U.S. Cl. .................................. 330/149; 330/151
[58] Field of Search ............... 330/149, 151, 252, 306; 333/14

[56] References Cited

U.S. PATENT DOCUMENTS 4,547,741 10/1985 Katakura .............................. 330/149

Primary Examiner—Steven Mottola
Attorney, Agent, or Firm—Rothwell, Figg, Ernst & Kurz

[57] ABSTRACT

A noise reduction circuit includes a main signal path and an auxiliary signal path having a high-pass filter characteristic. The noise reduction circuit may be used as a compression circuit or an expansion circuit in conjunction with a transmitter or a receiver, respectively. The auxiliary signal path includes a voltage dividing circuit, a voltage-to-current coverting circuit; a differential amplifier, and a voltage buffer connected between an input terminal and an operational amplifier. The main signal path is constituted by a resistance connected between the input terminal and the operational amplifier. The noise reduction circuit improves precision by eliminating the influence of absolute value variation of resistance which can occur in integrated circuit fabrication.

4 Claims, 6 Drawing Sheets

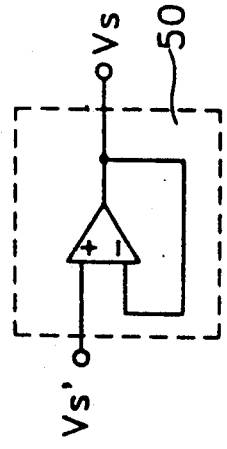
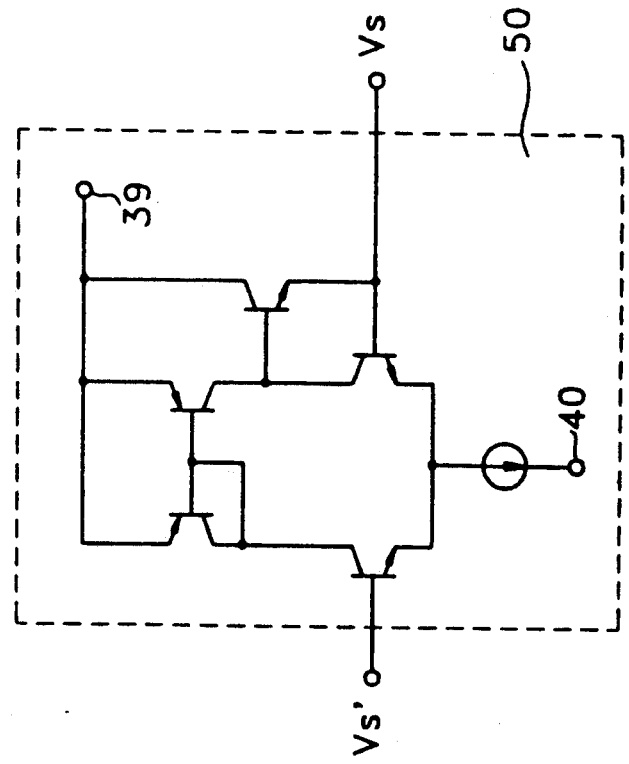
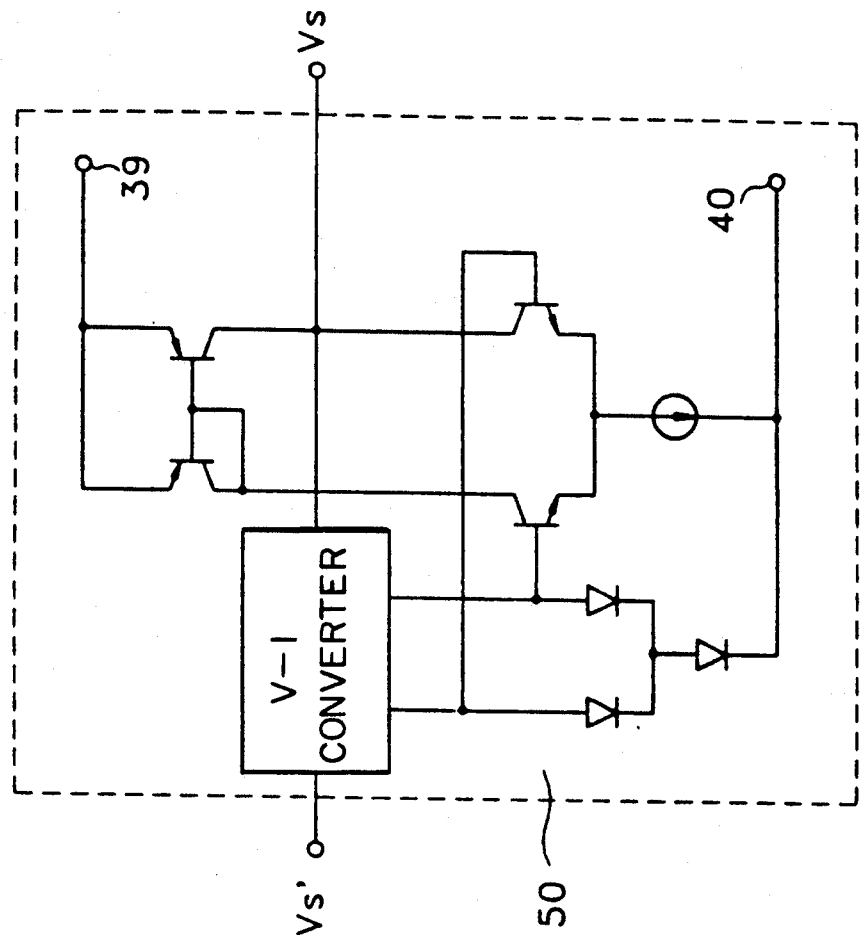
FIG. 5A
FIG. 5B
FIG. 5C

NOISE REDUCTION CIRCUIT WITH A MAIN SIGNAL PATH AND AN AUXILIARY SIGNAL PATH HAVING A HIGH-PASS FILTER CHARACTERISTIC

FIELD OF THE INVENTION

The present invention relates to a noise reduction circuit and, more particularly, to a noise reduction circuit with a main signal path and an auxiliary signal path which has a high-pass filter characteristic.

A known noise reduction circuit employs a compression circuit at the transmitter end to compress the signal during transmission, while at the receiver end, an expansion circuit is used for signal expansion during reception, thereby increasing the effective dynamic range of a signal's transmission path. This same signal compression and expansion approach has also been applied to recording and reproduction systems, by which the signal is compressed at the input to the recording device and is expanded during reproduction. These types of compression and expansion systems typically include circuits which have controllable transfer functions that vary depending upon signal level and/or frequency.

FIG. 1 shows a noise reduction circuit disclosed in U.S. Pat. No. 4,547,741. The following explanation has been extracted from this patent.

The noise reduction circuit in FIG. 1 operates basically as a compression circuit but can be switched between compression and expansion by a changeover switch 1. The input of an auxiliary signal path 2 is connected to a common terminal c of a changeover switch 1 having a terminal a connected to an input terminal 3 and another terminal b connected to an output terminal 4. Operational amplifier 5 sums the outputs from a main signal path 6 with that of auxiliary signal path 2, and is connected as an inverting amplifier, whereby the polarity of the output signal from amplifier 5 supplied to signal path 2 via terminal b is reversed with respect to the input signal. When changeover switch 1 connects to terminal a to effect signal compression, the signal compression transfer function C(s) between input terminal 3 and output terminal 4 may be expressed as:

$$C(s) = -(1 + T(s))$$

where T(s) represents the transfer function of the auxiliary signal path. The gain of the main signal path and that of the summing amplifier (operational amplifier 5) are selected to be 1 and −1, respectively. When changeover switch 1 is actuated, connecting terminals b and c, auxiliary signal path 2 provides a negative feedback signal path, and the signal expansion transfer function E(s) between input terminal 3 and output terminal 4 may be expressed as:

$$E(s) = \frac{1}{1 + T(s)}$$

In this manner, signal expansion is accomplished that is complementary to the above-described operation of signal compression.

The high-pass filter having a variable cut-off frequency is formed by a capacitor 7 and a current-controlled or voltage-controlled variable resistance 8. The output of the high-pass filter is supplied to a control circuit 9 and an amplitude limiting circuit 10 through an operational amplifier 11. The cut-off frequency control of circuit 9 is provided by a weighting circuit 12 that determines the weights of the high-frequency signal component, and a level sensor 13 which includes a half-wave or full-wave rectifier and a time constant circuit. The output signal from control circuit 9 controls the resistance of variable resistance 8. Amplitude limiting circuit 10 is formed by a pair of reversed PN junctions, e.g., diodes, connected in parallel, and has a limiting level concurrent with the particular elements chosen. For instance a silicon PN junction has a threshold value of approximately 1.2 $V_{p.p}$ as a limiter level. Because this value is large compared with normal design signal levels, the conventional practice has been to provide an amplifier (such as operational amplifier 11) before amplitude limiting circuit 10, whereby the output level of the high-pass filter is raised so that the limiter level will be at an optimum level relative to the signal level. Because of this signal level relationship, operational amplifier 11 is an essential circuit element not only as a buffer amplifier for the high-pass filter, but also to set the aforementioned limiter level. The output signal from auxiliary signal path 2 amplified by the operational amplifier 11, must also be multiplied by a small factor before it is added to the main signal.

This results in a signal of lowered precision due to these various operations of raising and lowering the signal's level, together with the correspondingly complicated circuit design. A further deficiency exists in this system in that the reverse bias current or drain current flowing in amplitude limiting circuit 10 affects the remainder of the circuit through the impedance of the common ground circuit.

SUMMARY OF THE INVENTION

It is an object of the invention to provide a noise reduction circuit which does not lack precision due to the absolute value variation of resistance value which possibly occurs in the process of IC fabrication.

To achieve the above object, in a noise reduction circuit with a main signal path and an auxiliary signal path having a high-pass filter characteristic, wherein the auxiliary signal path comprises voltage dividing means for dividing an input terminal voltage; voltage-to-current converting means having a first input terminal for inputting the divided voltage divided by the voltage dividing means, a second input terminal and first and second output terminals; a pair of PN junction transistors connected to the first and second output terminals of the voltage-to-current converting means; first differential amplifying means connected to the first and second output terminals and comprising a variable current source; feedback means for inputting the output signal of the first differential amplifying means to the second input terminal of the voltage-to-current converting means; and capacitance means connected between the output terminal of the differential amplifying means and the input terminal; the noise reduction circuit according to the present invention comprises:

operational amplifier means comprising a first resistance connected between an inverting input terminal and an output terminal, a second resistance connected at one end to the inverting input terminal, a third resistance connected between the input terminal and the inverting input terminal, amplitude limiting means connected between the output terminal and the other end of the second resistance, and a ground potential connected to a non-inverting input terminal; and a voltage buffer connected between the output terminal of the first differential amplifying means and the other end of the second resistance.

BRIEF DESCRIPTION OF THE DRAWINGS

The above object and other advantages of the present invention will become more apparent by describing the preferred embodiments of the present invention with reference to the attached drawings, in which:

FIG. 5A shows a voltage buffer using an operational amplifier;

FIG. 5B shows a voltage buffer using a differential amplifier;

FIG. 5C shows a voltage buffer formed by adding a differential amplifier to a current amplifying stage.

DETAILED DESCRIPTION OF THE INVENTION

In encoding, an operating result of the main signal path and the auxiliary signal path can be represented as:

$$V_o(s) = V_i\left(\frac{R_1}{R_3}\right) + T(s)\left(\frac{R_1}{R_2}\right)Av$$

Accordingly, the influence of the resistance value is neglected by an offset of the variation rate of resistance $R_2$ and $R_3$.

Figure 1:
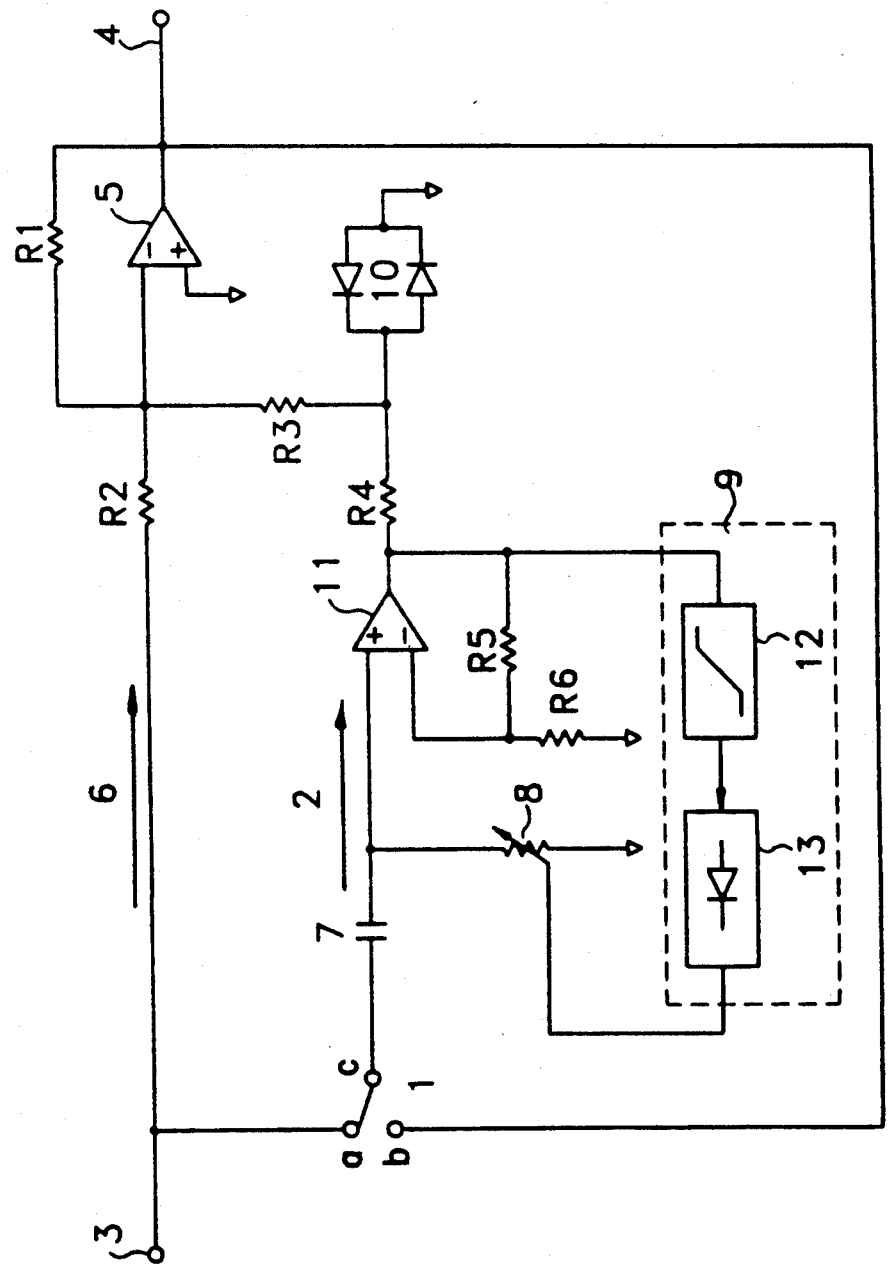
FIG. 1 shows a known noise reduction circuit.
Figure 2:
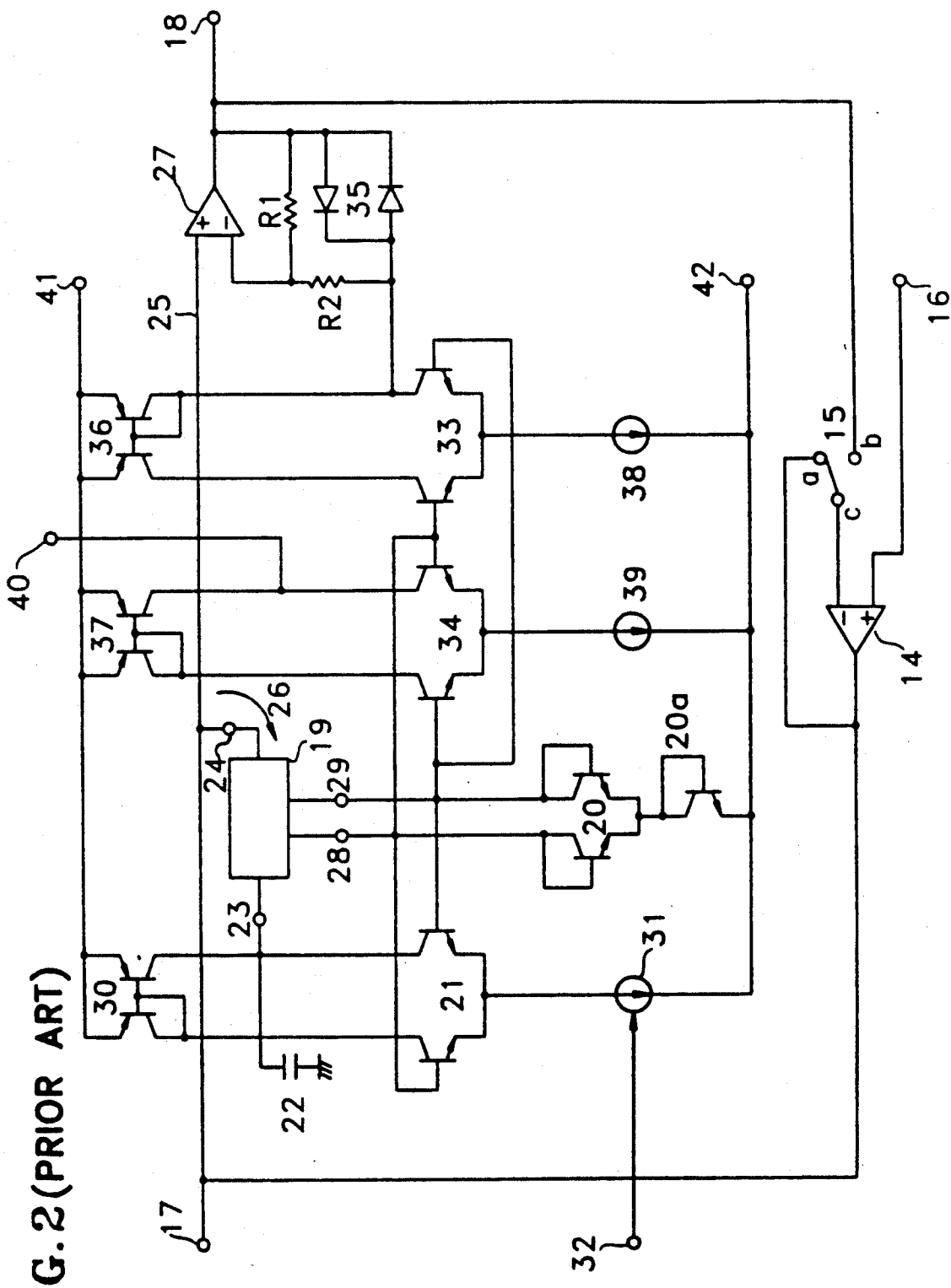
FIG. 2 shows a conventional noise reduction circuit.

A circuit for solving the problem of FIG. 1 is shown in FIG. 2, which is the noise reduction circuit disclosed in the aforementioned U.S. patent.

Referring to FIG. 2, the switching between compression and expansion is effected by changing the connection between operational amplifier 14 and the main circuit portion that provides the compression capability. When changeover switch 15 is set to connect terminals a and c, operational amplifier 14 acts as a unity gain amplifier or voltage follower, so that the input signal fed to input terminal 16 is supplied in an unmodified form by operational amplifier 14 to input terminal 16 of the main compression circuit and the compressed output signal is produced at output terminal 18. When switch 15 is set to connect terminals b and c, the compression circuit is connected as an input to operational amplifier 14, so that the portion of the circuit between input terminal 16 and output terminal 18 now performs signal expansion, which is complementary to the signal compression described hereinabove.

Referring to the high-pass filter circuit, the equivalent resistance formed by a voltage-to-current converter 19, a PN junction pair 20, and a first common-emitter transistor pair 21, is not connected directly to ground but is floating, connected to ground only through a capacitor 22. Capacitor 22 is connected to one differential input 23 of voltage-to-current converter 19 with the other differential input 24 being connected to main signal path 25. The output of the first common-emitter transistor pair 21 is also connected to differential input terminal 23 in a feedback circuit configuration. An auxiliary signal path including a high-pass filtering characteristic with a variable cut-off frequency, runs between input terminal 17 and output terminal 18 in parallel with the main signal path. The output from main signal path 25 and the output from auxiliary signal path 26 are summed by operational amplifier 27 and the summed signals are supplied to output terminal 18. Although not shown, the control circuit for varying the cut-off frequency of the high-pass filter in the auxiliary signal path 26 is typically constructed and arranged so that the auxiliary signal path output is sampled, the signal level of the sampled output detected, and the value of the resistance component of the filter circuit portion of the auxiliary signal path is varied depending upon the detected output level.

Differential output terminals 28 and 29 of voltage-to-current converter 19 are connected to the ends of a PN junction pair 20 formed of two transistors connected as diodes and having common connections at the other (cathode) ends.

Also connected, respectively, to terminals 28 and 29 of voltage-to-current converter 19, are the base electrodes of a first pair of transistors 21 connected in a common-emitter configuration. A current inverter or current mirror circuit 30 is connected between the collector electrodes of first common-emitter transistor pair 21 and the output current therefrom is fed back to differential input terminal 23 of voltage-to-current converter 19. Current source 31 is connected to the common-emitter circuit of first common-emitter transistor pair 21, and the current flowing in current source 31 is controlled by the output of the above-described cut-off frequency control circuit (not shown), through control input terminal 32.

The base electrodes of second common-emitter transistor pair 33 are respectively connected to the output terminals 28 and 29 of voltage-to-current converter 19, as are the base electrodes of a third common-emitter transistor pair 34, which provides the high-pass filter output to amplitude limiting circuit 35. Current mirror circuits 36 and 37 are connected as loads to second and third common-emitter transistor pairs 33 and 34, respectively, and second and third current sources 38 and 39 are connected to the common-emitter paths of transistor pairs 33 and 34, respectively.

The output current from the collector circuit of second common-emitter transistor pair 33 is the auxiliary signal path output fed to amplitude limiting circuit 35 and on to the inverting input of operational amplifier 27, which functions as the signal path summing means. This auxiliary signal path output is summed with the main signal path output in operational amplifier 27, and the resultant output signal is fed to output terminal 18. The output of third common-emitter transistor pair 34 is tapped at terminal 40 to be supplied to control input terminal 32 through the above-described control circuit (not shown). Terminals 41 and 42 designate plus and minus voltage source connections, respectively.

In FIG. 2, a transfer function of the auxiliary signal path is represented by:

$$T(s) = \frac{bs}{s + a}$$

The output of the transfer function can prescribe the current and the operating result of the main signal and the auxiliary signal is represented by:

$$V_o(s) = V_i + (V_i + T(s))gm \cdot R_1 V_i$$
$$= V_i(1 + T(s)gm \cdot R_1)$$

where transconductance gm is the ratio of the auxiliary signal output current to the main signal input voltage.

That is, since the operating result is represented by a function of resistance ($R_1$), variation in $R_1$ directly translates into variation in the output. Accordingly, the circuit shown in FIG. 2 lacks precision due to the absolute value variation of a resistance value.

Figure 3:
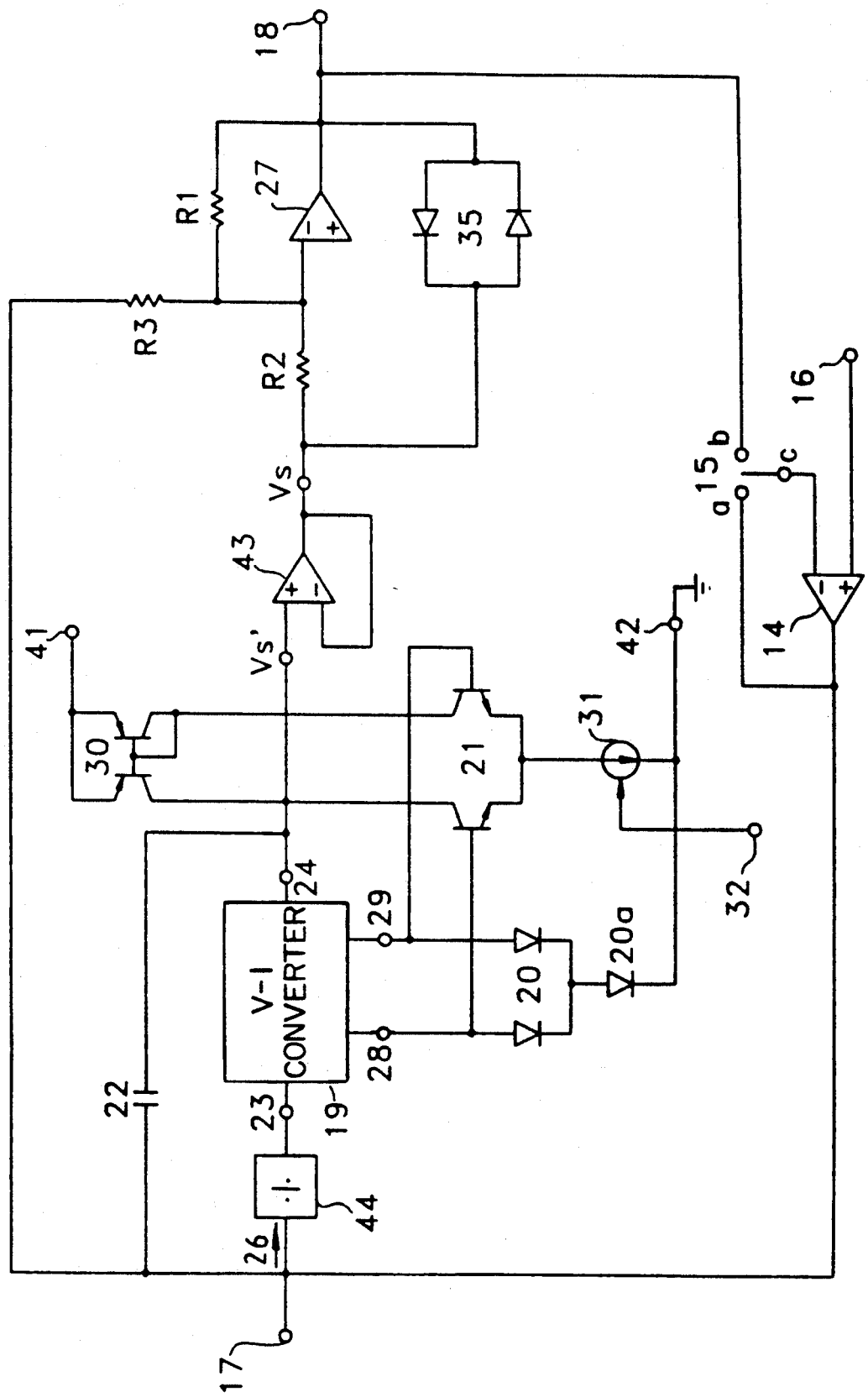
FIG. 3 shows a noise reduction circuit of an embodiment according to the present invention.

FIG. 3 shows a noise reduction circuit according to the present invention which solves the problems of FIGS. 1 and 2.

In FIG. 3, a main signal path is defined as being from an input terminal 17 to the inverting input of an operational amplifier 27 via a resistance $R_3$. Input terminal 17 is also connected to the input of a voltage dividing circuit 44 whose output is connected to the input of a voltage-to-current converter circuit 19. A terminal 24 of voltage-to-current converter circuit 19 is connected to input terminal 17 via a capacitor 22 which constitutes a high-pass filter. Output terminals 28 and 29 of voltage-to-current converter circuit 19 are respectively connected to the anodes of a pair of PN junction devices 20. The common cathodes of the pair of PN junction devices 20 are connected to the anode of a PN junction device 20a whose cathode is at ground potential through a terminal 42. The output of a differential amplifier having a current mirror 30, a pair of common-emitter transistors 21, and a variable constant current source 31 controlled from a terminal 32, is fed back to input terminal 24 of voltage-to-current converting circuit 19. The output of the differential amplifier is also connected to the non-inverting input of a voltage buffer 43.

The output of voltage buffer 43 is connected to the inverting input of operational amplifier 27 through a resistance $R_2$, and to one end of an amplitude limiting circuit 35. The non-inverting input of operational amplifier 27 is grounded. An output terminal 18 is connected to the other end of the amplitude limiting circuit, the output of operational amplifier 27, and to one end of a resistance $R_1$ whose other end is connected to the inverting input of the operational amplifier. Operational amplifier 27 sums the output voltages of the main signal path and the auxiliary signal path.

Figure 4A:
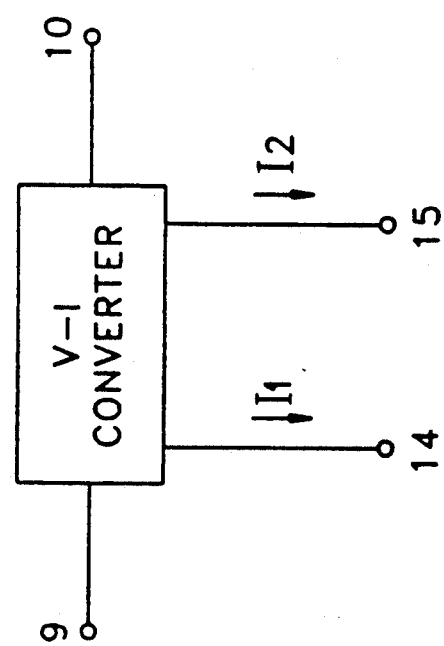
FIGS. 4A and 4B are typical voltage-to-current converting circuits.
Figure 4B:
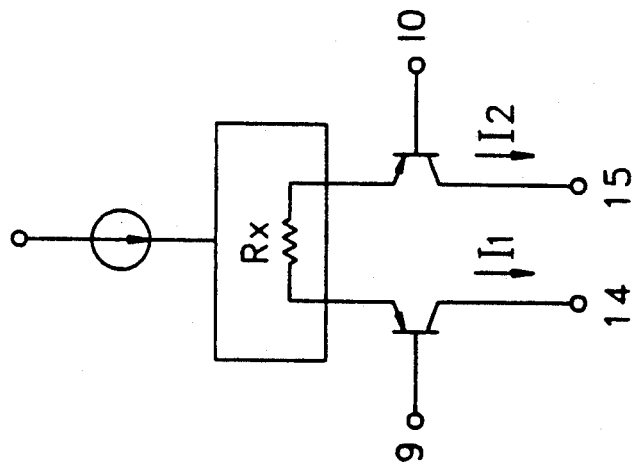

FIGS. 4A and 4B illustrate an embodiment of a known voltage-to-current converting circuit.

FIG. 5A shows the voltage buffer in FIG. 3. An input voltage Vs' represents the output signal of the high-pass filter, while an output voltage Vs represents the buffered output signal.

FIG. 5B shows the voltage buffer of FIG. 3 using a differential amplifier which includes a current mirror, a pair of common-emitter transistors, and a constant current source. The base electrode of the common-emitter transistors receives the input voltage Vs'. The collector electrode of the other common-emitter transistor is connected to the base electrode of an NPN transistor which provides the output signal Vs.

FIG. 5C shows the voltage buffer of FIG. 3 using the voltage-to-current converting circuit. The circuit shown here has the same construction as a portion of FIG. 3, specifically, voltage-to-current converting circuit 19, the pair of PN junction devices 20, current mirror 30, the pair of common-emitter transistors 21, and constant current source 31. The input voltage Vs' is connected to terminal 24 of voltage-to-current converting circuit 19, and output voltage Vs becomes the output of the differential amplifier.

Figure 6:
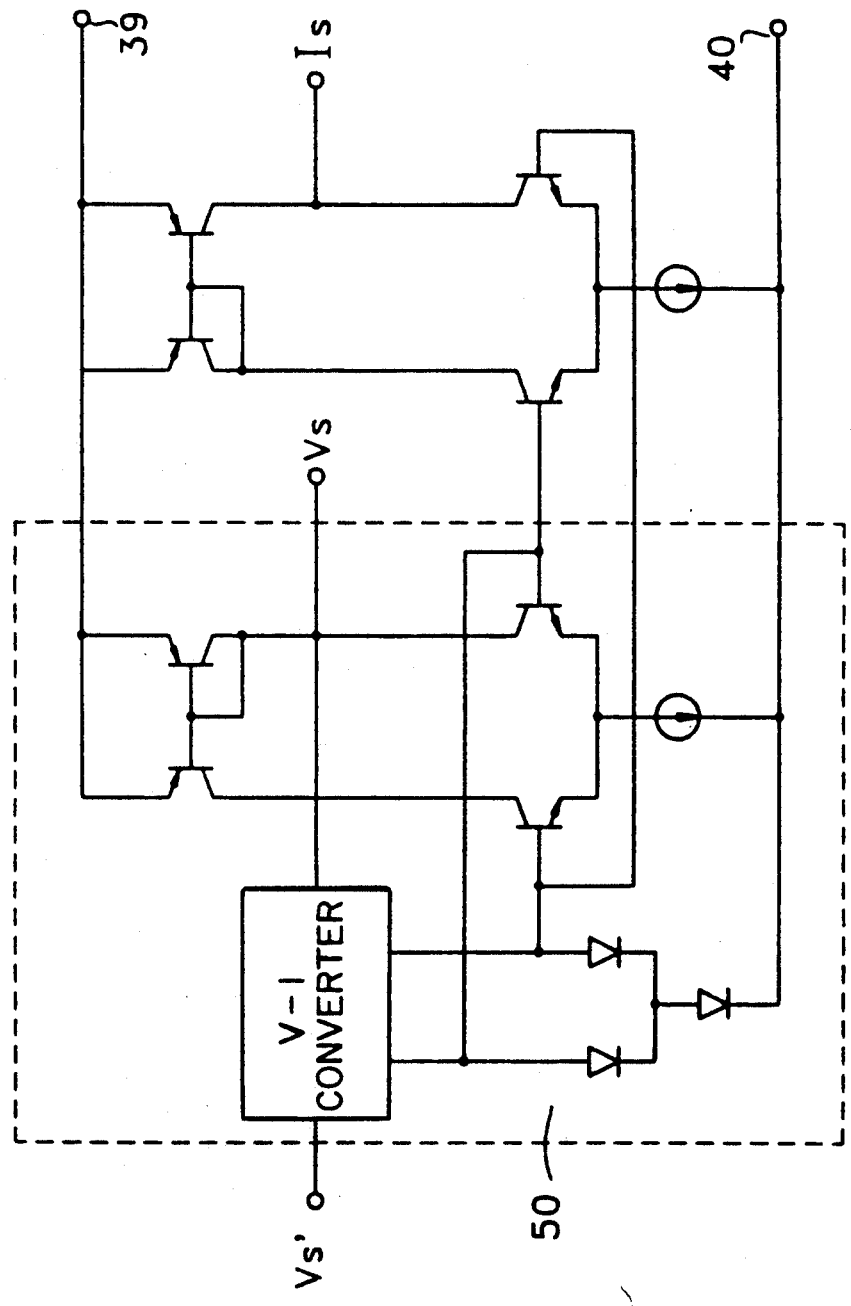
FIG. 6 shows a buffer formed by adding a differential amplifier to the voltage buffer shown in FIG. 5C.

FIG. 6 shows a further connection of a differential amplifier to the voltage buffer shown in FIG. 5C. Here, the circuit provides a current output signal $I_S$ to a level weighting circuit (not shown).

If an input signal $V_i$ is applied to voltage dividing means 44 at terminal 17 (FIG. 3), the divided voltage ($XV_i$) present at input terminal 23 of voltage-to-current converting circuit 19 shows the output terminal voltage Vs' of the differential amplifier that is fed back to input terminal 24. A current $I_1$ flowing through voltage-to-current converting circuit 19 can be represented as $sC \times Vs' - V_i$, and the voltage between output terminals 28 and 29 can be represented as $XV_i + Vs'$.

Therefore, the transfer function of the high-pass-filter is represented by:

$$T_1(s) = \frac{V_s'}{V_i} = \frac{1 + \left(\frac{sC}{gm \cdot X}\right)}{1 + \left(\frac{sC}{gm}\right)}$$

where gm is the transconductance between the voltage-to-current converting circuit and the pair of common-emitter transistors. Additionally, the output voltage Vs of voltage buffer 43 is equal to a voltage $V_i T(s)$.

Accordingly, the output voltage $V_o$ of operational amplifier 27 is represented by:

$$V_o = V_i\left(\frac{R_1}{R_3}\right) + T(s)V_i\left(\frac{R_1}{R_2}\right)K$$

where K is an auxiliary gain constant.

In the above equation, the possible occurrence of variation in resistances will offset each other, since a variation rate of resistances $R_3$ and $R_2$ will equal that of $R_1$. Accordingly, the circuit according to the present invention solves the above-mentioned precision problem.

Further, the transfer function of the noise reduction circuit according to the present invention is represented by:

$$T_2(s) = \frac{V_o}{V_i} = \frac{R_1}{R_3} + \frac{R_1}{R_2}\left(\frac{1 + \frac{sC}{gm \cdot X}}{1 + \frac{sC}{gm}}\right)K$$

The circuit has the characteristic of a general noise reduction circuit having one zero and one pole.

The circuit according to the present invention improves the operation of the conventional noise reduction circuit by using the relative ratio of resistance values to offset the lack of precision due to the absolute variation of those resistances which, when operating with auxiliary and main signal paths, might occur during IC fabrication.

Moreover, the circuit can improve the conventional noise reduction circuit characteristics by positioning a voltage buffer between the high-pass filter and operational amplifier, which prevents the input impedance of the operational amplifier from having an adverse effect on the high-pass filter, occurring when the output of the high-pass filter directly feeds the operational amplifier.

What is claimed is:

1. A noise reduction circuit having a main signal path and an auxiliary signal path, comprising:
    voltage dividing means for dividing a voltage at an input terminal of said circuit and outputting a divided voltage;
    voltage-to-current converting means having a first input terminal coupled to receive said divided output voltage, a second input terminal, and first and second output terminals;
    a pair of PN junction devices respectively connected to said first and second output terminals of said voltage-to-current converting means;
    differential amplifying means for producing a difference between current signals outputted at said first and second output terminals of said voltage-to-current converting means as an output signal at an output terminal thereof, said differential amplifying means including first and second input terminals connected to said first and second output of terminals of said voltage-to-current converting means and a variable current source;
    feedback means for applying the output signal of said differential amplifying means to the second input terminal of said voltage-to-current converting means;
    capacitor means coupling said output terminal of said differential amplifying means to said input terminal of said circuit;
    operational amplifier means including an inverting input terminal and an output terminal;
    a first resistance connected between said inverting input terminal and said output terminal of said operational amplifier means;
    a second resistance connected at one thereof to said inverting input terminal;
    a third resistance connected between said input terminal of said circuit and said inverting input terminal;
    amplitude limiting means connected between said output terminal of said operational amplifier means and the other end of said second resistance; and
    a voltage buffer connected between said output terminal of said differential amplifying means and said other end of said second resistance;
    said main signal path being defined from said input terminal of said circuit to said inverting input terminal through said third resistance, and said auxiliary signal path being defined from said input terminal of said circuit to said inverting input terminal through said voltage dividing means, said voltage-to-current converting means, said voltage buffer, and said second resistance, and having a high-pass filter characteristic.

2. A noise reduction circuit as claimed in claim 1, wherein said voltage buffer comprises:
    second differential amplifying means having a first differential input terminal acting as an input terminal and a second differential input terminal acting as an output terminal;
    a NPN transistor having a base electrode connected to an output terminal of said second differential amplifying means, a collector electrode connected to a power supply voltage, and an emitter electrode connected to said first differential input terminal.

3. A noise reduction circuit as claimed in claim 1, wherein said voltage buffer comprises:
    second voltage-to-current converting means having first and second input terminals and first and second output terminals;
    a pair of a PN junction devices connected to said first and second output terminals of said second voltage-to-current converting means;
    second differential amplifying means connected to said first and second output terminals of said second voltage-to-current converting means;
    wherein an output terminal of said second differential amplifying means acts as an output terminal of said voltage buffer and is connected to said second input terminal of said voltage-to-current converting means.

4. A noise reduction circuit as claimed in claim 1, wherein said voltage buffer comprises:
    second voltage-to-current converting means having first and second input terminals and first and second output terminals;
    a pair of PN junction devices connected to said first and second output terminals of said second voltage-to-current converting means;
    second differential amplifying means connected to said first and second output terminals of said second voltage-to-current converting means;
    third differential amplifying means connected to said first and second output terminals of said second voltage-to-current converting means;
    wherein an output terminal of said second differential amplifying means acts as a first output terminal of said voltage buffer connected to said second input terminal of said second voltage-to-current converting means, and an output terminal of said third differential amplifying means acts as a second output terminal of said voltage buffer.

* * * * *